United States Patent
Mikhael

(10) Patent No.: US 10,671,104 B2
(45) Date of Patent: Jun. 2, 2020

(54) SIGNAL GENERATION CIRCUITRY

(71) Applicant: SOCIONEXT INC., Yokohama-shi, Kanagawa (JP)

(72) Inventor: David Hany Gaied Mikhael, Langen (DE)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/244,016

(22) Filed: Jan. 9, 2019

(65) Prior Publication Data

US 2019/0227587 A1     Jul. 25, 2019

(30) Foreign Application Priority Data

Jan. 19, 2018 (EP) ...................................... 18152588

(51) Int. Cl.
*G05F 1/567* (2006.01)
*G05F 1/46* (2006.01)
(Continued)

(52) U.S. Cl.
CPC .............. *G05F 1/567* (2013.01); *G05F 1/468* (2013.01); *G05F 1/575* (2013.01); *G05F 3/30* (2013.01); *H03F 3/45179* (2013.01); *H03F 2200/129* (2013.01); *H03F 2200/468* (2013.01); *H03F 2203/45116* (2013.01); *H03F 2203/45528* (2013.01)

(58) Field of Classification Search
CPC .................................. G05F 1/567; G05F 1/575
USPC ................. 327/539; 323/265, 266, 273, 281, 323/311–315, 349
See application file for complete search history.

(56) References Cited

U.S. PATENT DOCUMENTS

| | | | |
|---|---|---|---|
| 5,861,736 A | 1/1999 | Corsi et al. | |
| 6,271,652 B1 * | 8/2001 | Burstein | ................... G05F 3/30 323/313 |

(Continued)

FOREIGN PATENT DOCUMENTS

| | | |
|---|---|---|
| EP | 2 804 067 A1 | 11/2014 |
| EP | 2 977 849 A1 | 1/2016 |

OTHER PUBLICATIONS

Extended European Search Report issued in corresponding European Patent Application No. 18152588.2 dated Sep. 20, 2018.

*Primary Examiner* — Tomi Skibinski
(74) *Attorney, Agent, or Firm* — Arent Fox LLP

(57) ABSTRACT

Signal-generation circuitry comprises: a differential amplifier comprising first and second input transistors, connected along respective current paths and having control terminals serving as corresponding first and second input terminals of the differential amplifier, and an output terminal at which an amplified signal is output dependent on input signals received at the input terminals; bandgap voltage reference circuitry comprising the first input transistor and a third input transistor whose control terminals are connected together to form a reference terminal at which a bandgap voltage reference signal is generated as a first input signal; and a regulation stage connected to receive the amplified signal output from the differential amplifier and configured to generate a voltage-regulated signal based thereon, and connected to the second input terminal of the differential amplifier so that the second input signal is a feedback signal dependent on the voltage-regulated signal.

20 Claims, 3 Drawing Sheets

(51) Int. Cl.
    *G05F 3/30*     (2006.01)
    *G05F 1/575*     (2006.01)
    *H03F 3/45*     (2006.01)

(56) References Cited

U.S. PATENT DOCUMENTS

| | | |
|---|---|---|
| 7,602,162 B2 | 10/2009 | Bansal et al. |
| 2009/0302823 A1 | 10/2009 | Chao et al. |
| 2016/0258819 A1* | 9/2016 | Xia .......................... G01K 7/01 |

* cited by examiner

SIGNAL GENERATION CIRCUITRY

CROSS REFERENCE TO RELATED APPLICATION

This application claims priority from European Patent Application No. 18152588.2 filed Jan. 19, 2018. The entire contents of the print application are incorporated herein by reference.

The present invention relates to signal-generation circuitry, for example for generating low-noise signals.

Such a low-noise signal may be a voltage-regulated signal, which may be useful in phase locked loop (PLL) circuitry of analogue-to-digital or digital-to-analogue converter circuitry which is required to have a high degree of accuracy. Another example may be a temperature sensor signal. Another example may be a bandgap voltage signal.

By way of background, conventional bandgap circuitry is used to generate a fixed and accurate reference voltage signal, i.e. whose voltage level is stable and independent of temperature. An output node of a bandgap circuit may be connected to external circuitry in order to provide the reference voltage signal to that external circuitry.

Such a bandgap circuit unfortunately typically becomes unstable if significant current is drawn from the output node of the bandgap circuit e.g. by a resistive load. By connecting the output node to a resistive load, and thereby causing current to be drawn from that node, a typical bandgap circuit will malfunction. Consequently, typical bandgap circuits cannot be used to supply their reference voltage signals directly to current-drawing external circuitry. The fixed reference voltage output by conventional bandgap circuitry is also difficult to increase above a certain value.

However, such bandgap circuitry may be connected to low dropout (LDO) circuitry—or regulation circuitry—in order to provide a regulated reference voltage to a resistive load.

FIG. 1 is a schematic diagram of previously-considered bandgap-regulator circuitry 180 comprising such LDO circuitry. Circuitry 180 comprises a reference-voltage generator 100 and an LDO output stage 140.

The LDO output stage 140 comprises an operational amplifier (differential amplifier) 120, a transistor 142, a first resistor 144, a second resistor 146, a capacitor 148, a VDD voltage supply 160 and a ground (GND) voltage supply 170. The operational amplifier 120 has a first operational amplifier input 122, a second operational amplifier input 124, and an operational amplifier output 126.

The reference-voltage generator 100 (which is a bandgap circuit) has a reference-voltage generator output node 102, and is configured to provide a fixed reference voltage signal (i.e. a bandgap voltage signal having a stable voltage level independent of temperature) at the reference-voltage generator output node 102. The reference-voltage generator output node 102 is connected to the first operational amplifier input 122 such that the reference voltage signal is input to the operational amplifier 120.

The transistor 142 may be, for example, a PMOS MOSFET. In a case where the transistor 142 is a PMOS MOSFET, the first operational amplifier input 122 is the inverting input and the second operational amplifier input 124 is the non-inverting input.

The operational amplifier output 126 is connected to the gate terminal of the transistor 142 of the LDO output stage 140, and the transistor 142 is connected between the voltage supply 160 and a bandgap-regulator circuitry output node 150, at which a regulated-reference voltage is to be supplied to the resistive load of external circuitry.

The first and second resistors 144 and 146 are connected between the output node 150 and the voltage supply 170 so as to form a potential divider. A feedback node 152 is defined between the first resistor 144 and the second resistor 146, and is connected to the second operational amplifier input 124 so that a feedback voltage signal present at the feedback node is fed back to the operational amplifier 120.

It will be appreciated that the LDO output stage 140 operates to maintain or regulate the voltage level of the feedback voltage signal so that it is the same as that of the reference voltage signal. Any potential difference between those signals will cause a potential difference between the first and second operational amplifier inputs 122 and 124, and the transistor 142 will thus be controlled to adjust the amount of current flowing through it to bring the voltage level of the feedback voltage signal back towards that of the reference voltage signal. This in turn regulates the voltage level of the signal provided at the bandgap-regulator circuitry output node 150 and thus provides the desired regulated reference voltage signal to the resistive load of the external circuitry in a form in which current can be drawn. Thus, the LDO output stage 140 acts as a non-inverting amplifier and buffer that supplies the required current to the load.

The capacitor 148 is connected between the bandgap-regulator circuitry output node 150 and the ground voltage supply 170 and is configured to filter high frequency noise from the regulated-reference voltage signal.

Despite the provision of such bandgap-regulator circuitry 180, and the stability benefits afforded by the operational amplifier 120 and the LDO output stage 140, it has been found that the previously-considered bandgap-regulator circuitry 180 suffers from problems such as noise and interference.

In particular, the operational amplifier 120 serves as a noise contributor for the thermal noise floor. The input transistor pair (not shown) of the operational amplifier 120 usually suffer from flicker noise as well. Further, if plural LDO output stages 140 share the same reference-voltage generator 100, cross-talk and coupling can feed from one LDO output stage 140 to another causing further noise performance degradation.

It is desirable to solve some or all of the above-mentioned problems.

According to an embodiment of a first aspect of the present invention, there is provided signal-generation circuitry comprising: a differential amplifier comprising first and second (complementary) input transistors connected along first and second corresponding current paths, control terminals of the first and second input transistors serving as corresponding first and second input terminals of the differential amplifier, the differential amplifier having an output terminal at which an amplified signal is output dependent on first and second input signals received at the first and second input terminals, respectively; bandgap voltage reference circuitry also comprising said first current path having said first input transistor, the bandgap voltage reference circuitry further comprising a third current path having a third input transistor, wherein the control terminals of the first and third input transistors are connected together to form a reference terminal at which a bandgap voltage reference signal is generated as said first input signal; and a regulation stage connected to receive the amplified signal output from the differential amplifier and configured to generate a voltage-regulated signal based thereon, and connected to the second input terminal of the differential amplifier so that the second input signal is a feedback signal dependent on the voltage-regulated signal.

Thus, there are shared components between the differential amplifier and the bandgap voltage reference circuitry, leading to improved noise performance. Further details of the associated advantages are provided later herein.

The output terminal of the differential amplifier may be a node on the first current path.

A capacitance may be connected between the output terminal and the reference terminal, to filter noise generated by the first and third input transistors at the reference terminal.

The first and second input transistors are matched transistors, configured in the same way as one another. For example, they may have the same size or gain as one another.

The first, second and third input transistors may be bipolar junction transistors, and the control terminals of those transistors may be base terminals of those transistors.

The emitter terminals of the first and second input transistors may be connected together forming a common tail node at which the first and second current paths converge.

The common tail node may be connected to the emitter terminal of the third input transistor via a first resistor, the first and second current paths passing from the common tail node through the first resistor. The emitter terminal of the third input transistor may be connected to a voltage reference source via a second resistor, the first, second and third current paths passing from the emitter terminal of the third input transistor through the second resistor.

The first, second and third current paths may comprise first, second and third current-mirror transistors, respectively, connected together in a current-mirror arrangement configured to control currents flowing along the first and third current paths so that they are dependent on a current flowing along the second current path due to current mirroring.

The first and third current-mirror transistors may have a size ratio 1:M and the first and third input transistors may have a size ratio N:1. In that case, the product of M and N should be greater than 1, where M and N are positive numbers (e.g. integers). The first and third current-mirror transistors may have a size ratio AB and the first and third input transistors may have a size ratio C:D. In that case, the product of B and C should be greater than the product of A and D, where A, B, C and D are positive numbers (e.g. integers).

The current-mirror transistors may be FETs, such as MOSFETs.

The reference terminal of the bandgap voltage reference circuitry may be for providing a bandgap voltage reference signal to external circuitry, the signal-generation circuitry serving as a bandgap voltage reference source. Such signal-generation circuitry may have improved noise performance as compared to previously-considered bandgap voltage reference sources.

The bandgap voltage reference circuitry may comprise a temperature-sensor node which provides a temperature-sensor voltage signal which is dependent on temperature, the signal-generation circuitry serving as a temperature sensor. Such signal-generation circuitry may have improved noise performance as compared to previously-considered temperature sensors.

The regulation stage may be an output stage configured to provide the voltage-regulated signal as an output signal at an output terminal of the reference circuitry to power an external circuit, the signal-generation circuitry serving as a voltage regulator. Such signal-generation circuitry may have improved noise performance as compared to previously-considered voltage regulators.

The regulation stage may comprise an output transistor connected to control a voltage at the output terminal in dependence upon the amplified signal. The output transistor may be connected to draw current from a voltage supply terminal.

The regulation stage may comprise a potential divider connected to provide the feedback signal based on the voltage-regulated signal.

According to an embodiment of a second aspect of the present invention, there is a provided phase locked loop circuit comprising the signal-generation circuitry according to the aforementioned first aspect of the present invention.

According to an embodiment of a third aspect of the present invention, there is provided an integrated circuit such as an IC chip comprising the signal-generation circuitry according to the aforementioned first aspect of the present invention.

Reference will now be made, by way of example, to the accompanying drawings, of which:

FIG. 1, considered above, is a schematic diagram of bandgap regulator circuitry;

Figure 2:
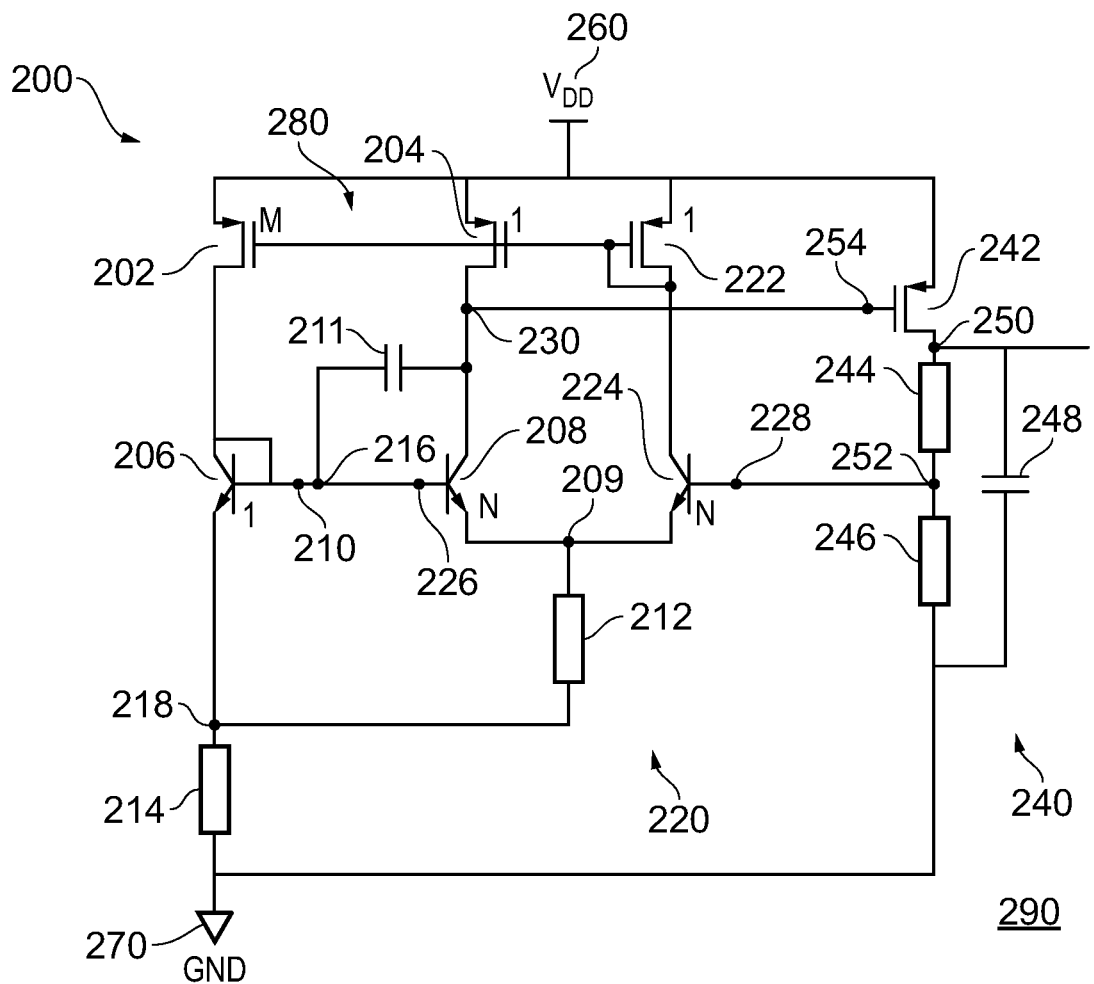
FIG. 2 is a schematic diagram of signal-generation circuitry embodying the present invention.

FIG. 2 is a schematic diagram of signal-generation circuitry 290 embodying the present invention. Signal-generation circuitry 290 comprises a differential amplifier 220, bandgap reference circuitry 200, and a regulation stage 240.

Figure 1:
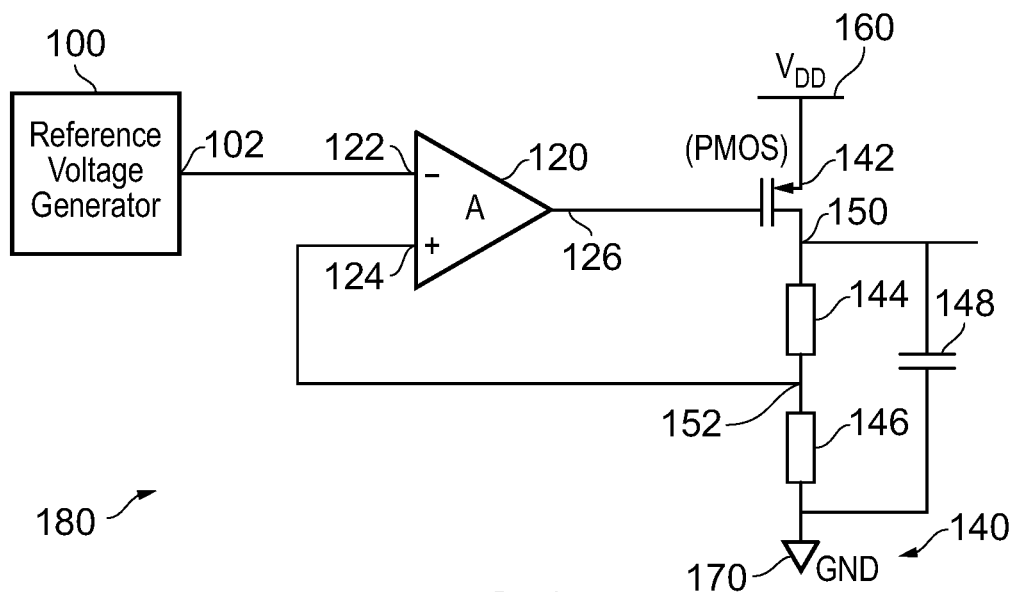

In terms of general function, the differential amplifier 220 may be compared with the operational amplifier 120 of FIG. 1, the bandgap reference circuitry 200 may be compared with the reference-voltage generator 100 of FIG. 1, and the regulation stage 240 may be compared with the elements of the LDO output stage 140 of FIG. 1 other than the operational amplifier 120. Thus, the general function of the signal-generation circuitry 290 corresponds to the general function of the bandgap-regulator circuitry 180. However, the performance of the signal-generation circuitry 290 is considered to exceed that of the bandgap-regulator circuitry 180 for various reasons, as will become apparent.

The differential amplifier 220 comprises a first input transistor 208, a second input transistor 224, a first current-mirror transistor 204, a second current-mirror transistor 222, a resistor 212 and a resistor 214.

The first input transistor 208 is connected along a first current path and the second input transistor 224 is connected along a second current path. The first and second input transistors 208 and 224 are bipolar junction transistors (BJTs), each having base, emitter and collector terminals, and are preferably complementary/matched transistors (e.g. having matching—i.e. the same—DC-current gains ($\beta$) or having matching sizes) which form a differential pair and are connected together at their emitter terminals at a common node 209 at which the first and second current paths converge.

The first and second current-mirror transistors 204 and 222 are PMOS MOSFETs each comprising a gate terminal, a source terminal and a drain terminal. The first current-mirror transistor 204 is connected along the first current path between a VDD voltage supply 260 and the collector terminal of the first input transistor 208. Similarly the second current-mirror transistor 222 is connected along the second current path between the VDD voltage supply 260 and the collector terminal of the second input transistor 224.

The second current-mirror transistor 222 is diode-connected whereby its gate terminal is connected to its drain terminal such that the second current-mirror transistor 222 is forced into the saturation region (some low-power arrangements could have the transistor in subthreshold rather than saturation). Further, the gate terminals of the first and second current-mirror transistors 204 and 222 are connected together. Thus, the first and second current-mirror transistors 204 and 222 have the same gate voltages and source voltages and serve as part of a current-mirror arrangement 280 in which the current flowing in the first path through first current-mirror transistor 204 is related to the current flowing in the second path through the second current-mirror transistor 222 due to current mirroring. In the present case, the first and second current-mirror transistors 204 and 222 are configured (e.g. sized) the same as one another so that the current flowing in the first path is substantially equal to the current flowing in the second path due to current mirroring.

The resistors 212 and 214 are connected in series between the common tail node 209 and a ground (GND) voltage supply 270, and define a node 218 between them. Thus, the first and second current paths pass in common through the resistors 212 and 214. One or both of the resistors 212 and 214 could be implemented as transistors.

The base terminals 226 and 228 of the first and second input transistors 208 and 224, serve as first and second input terminals of the differential amplifier 220, and correspond to the first and second operational amplifier inputs 122 and 124 of FIG. 1, respectively. The collector terminal 230 of the first input transistor 208 serves as the output terminal 230 of the differential amplifier 220, and corresponds to the operational amplifier output 126 of FIG. 1.

The regulation stage 240 comprises output transistor (a PMOS MOSFET) 242, first and second potential-divider resistors 244 and 246 and an output filter capacitor 248, connected in the same way as the transistor 142, first and second resistors 144 and 146 and the capacitor 148 of FIG. 1, respectively. As an aside, the output transistor 242 could be implemented instead as an NMOS MOSFET 242 in which case the inputs to input terminals 226 and 228 would be swapped.

Thus, the output terminal 230 of the differential amplifier 220 is connected to the gate terminal of the transistor 242, which transistor is connected between the VDD voltage supply 260 and an output node 250 (corresponding to node 150), at which a regulated-reference voltage is to be supplied to the resistive load of external circuitry.

The first and second potential-divider resistors 244 and 246 are connected between the output node 250 and the ground (GND) voltage supply 270 so as to form a potential divider. A feedback node 252 (corresponding to node 152) is defined between the first potential-divider resistor 244 and the second potential-divider resistor 246, and is connected to the second input terminal 228 of the differential amplifier 220 so that a feedback voltage signal present at the feedback node 252 is fed back to the differential amplifier 220.

The capacitor 148 is optional but preferred.

The bandgap reference circuitry 200 provides a bandgap reference voltage signal at the first input terminal 226, in line with the reference-voltage generator 100. However, the bandgap reference circuitry 200 will be discussed in more detail later.

For now, it will be appreciated that the differential amplifier 220 and regulation stage 240 (like the LDO output stage 140) operate to maintain or regulate the voltage level of the feedback voltage signal so that it is the same as that of the bandgap reference voltage signal. Any potential difference between those signals will cause a potential difference between the first and second input terminals 226 and 228 of the differential amplifier 220, and the transistor 242 will thus be controlled to adjust the amount of current flowing through it to bring the voltage level of the feedback voltage signal back towards that of the reference voltage signal. This in turn regulates the voltage level of the signal provided at the output node 250 and thus provides the desired regulated reference voltage signal to the resistive load of the external circuitry in a form in which current can be drawn by that load.

Thus, the differential amplifier 220 and the regulation stage 240 together function as a LDO regulator circuit for generating the voltage-regulated signal. The voltage-regulated signal may be output to external circuitry such as, for example, phase locked loop (PLL) circuitry or indeed any circuitry (e.g. DACs and ADCs) that needs a voltage-regulated signal. The regulation function performed by the differential amplifier 220 and the regulation stage 240 serves to maintain a stable voltage-regulated signal (i.e. output voltage) even in a case where the voltage source used to supply power to the differential amplifier and the regulation stage operates at a voltage close to the desired voltage-regulated signal at the output node.

The capacitor 248 is connected between the output node 250 and the ground voltage supply 270 and is configured to filter high frequency noise from the regulated-reference voltage signal, thereby improving the signal-to-noise ratio (SNR) of the regulated-reference voltage signal which is output to external circuitry.

It is noted here that the first and second potential-divider resistors 244 and 246 serve as a potential divider for the case that the desired voltage level of the regulated reference voltage signal at the output node 250 is higher than that of the bandgap reference voltage signal provided at the first input terminal 226. The difference between these voltage levels is of course dependent on the resistance values of the first and second potential-divider resistors 244, 246. If the desired voltage level of the regulated reference voltage signal were to be the same as that of the bandgap reference voltage signal, the first and second potential-divider resistors 244 and 246 could be dispensed with and the feedback voltage signal could be taken from the output node 250 itself.

Focus will now be placed on the bandgap reference circuitry 200.

The bandgap reference circuitry 200 comprises the first current-mirror transistor 204, the first input transistor 208, the resistors 212 and 214, a third current-mirror transistor 202, and a third input transistor 206. Note in particular that the first current-mirror transistor 204, the first input transistor 208 and the resistors 212 and 214 are common or shared between the bandgap reference circuitry 200 and the differential amplifier 220. This leads to several advantages, as will be discussed later.

The third current-mirror transistor 202 and the third input transistor 206 are connected along a third current path which extends from the voltage supply 260 through the third current-mirror transistor 202, through the third input transistor 206 to the node 218 where it passes through the resistor 214 to the voltage supply 270. Thus, the first, second and third current paths converge at the node 218 and pass through the resistor 214.

The third current-mirror transistor 202 is a PMOS MOSFET comprising a gate terminal, a source terminal and a drain terminal. The gate terminal of the third current-mirror transistor 202 is connected to the gate terminals of the first and second current-mirror transistors 204 and 222. Thus, the first, second and third current-mirror transistors 204, 222 and 202 have the same gate voltages and source voltages and serve together as the current-mirror arrangement 280 in which the current flowing in the third path through the third current-mirror transistor 202 is related to the current flowing in the second path through the second current-mirror transistor 222 due to current mirroring. In the present case the third and second current-mirror transistors 202 and 222 are configured to have a size ratio M:1 so that the current flowing in the third path is substantially equal to M times the current flowing in the second path due to current mirroring. As already mentioned, first and second current-mirror transistors 204 and 222 are configured to have a size ratio 1:1 so that the current flowing in the third path is also substantially equal to M times the current flowing in the first path due to current mirroring.

The third input transistor 206 is a BJT transistor, and its base terminal 210 is connected to the base terminal 226 of the first input transistor 208, i.e. to the first input terminal 226 of the differential amplifier 220. This node (at terminals 210 and 226) may be referred to as a reference node 216 at which the bandgap voltage reference signal is generated. The generation of the bandgap voltage reference signal is explained in detail below. The base terminal 210 is also connected to the collector terminal of the third input transistor 206.

It will be recalled that the bandgap voltage reference signal generated at reference node 216 serves as the voltage reference signal input to the differential amplifier 220. A capacitor 211 is connected between the reference node 216 and the differential amplifier output terminal 230. The capacitor 211 is configured to filter shot noise and/or thermal noise associated with the first and third input transistors 208, 206, and may be a discrete/separate capacitor or may be the collector-to-base capacitance of the first input transistor 208 (i.e. Miller capacitance). The input capacitor 211 may be considered to comprise a combination of the discrete capacitor and the capacitance provided by the Miller effect in order to provide the total required capacitance for filtering shot noise. This capacitance may also act as the first dominant pole for the system.

The reference node 216 may be connected to external circuitry such as a separate LDO output stage 140, thereby providing the bandgap voltage reference signal as an external reference signal. Due to noise filtering provided by the capacitor 211, and the action of the differential amplifier 220, noise contributions from the first input transistor 208 and the third input transistor 206 are attenuated in the bandgap voltage reference signal that would be output to external circuitry such that that bandgap voltage reference signal may be considered a low-noise bandgap voltage reference signal.

The generation of the bandgap voltage reference signal in the bandgap reference circuitry 200 will now be explained.

The bandgap voltage reference signal generated at the reference node 216 is a temperature-independent reference voltage signal whose voltage level is generated as a result of summing two potential differences which exhibit opposing temperature coefficients. These opposing temperature coefficients arise because the base-emitter voltages ($V_{be}$) of the third input transistor 206 and the first input transistor 208 of the bandgap reference circuitry 200 (being BJTs) both exhibit a negative temperature coefficient.

Different currents are generated in the first and third current paths, respectively. This is achieved by setting the size ratio M:1 between the third current-mirror transistor 202 and the first current-mirror transistor 204, and the size ratio 1:N between the third input transistor 206 and the first input transistor 208. Recall that the first and second input transistors 208 and 224 are matched (size ratio N:N). This is so that that there is a difference $\Delta V_{be}$ between the $V_{be}$ for the first and third input transistors 208 and 206, which exhibits a positive temperature coefficient.

It will become apparent that the two ratios may be set so that the product of M and N is greater than 1. Either M or N (but not both) may be 1. M may equal N as long as they are not equal to 1. M and N are both positive numbers, and may be integers. For example, if M=1.5, the ratio M:1 may be expressed as 3:2. The present disclosure will be understood accordingly.

In detail, the collector current of the third input transistor 206 is given by:

$$I_c = I_0 \cdot e^{\frac{V_{G0} - V_{be}}{V_t}}$$

The $V_{be}$ for the third input transistor 206 (the potential difference between nodes 216 and 218) is given by:

$$V_{be,206} = V_{G0} - V_t \ln\frac{I_c}{I_0} = V_{G0} - \frac{k \cdot T}{q} \cdot \ln\frac{I_c}{I_0}$$

The derivative of $V_{be}$ with respect to temperature (T) is:

$$\frac{\partial V_{be,206}}{\partial T} \approx -2 \text{ mV/}^\circ \text{C.}$$

where, $V_{G0} \approx 1.22$ eV, k is the Boltzmann constant, q is the charge of an electron, T is temperature, $I_c$ is the collector current, $V_{be}$ is the base-emitter voltage and $I_0$ is a device parameter.

Thus, $V_{be}$ for the third input transistor 206 varies negatively with temperature—i.e. it exhibits a negative temperature coefficient. This relies on the negative temperature coefficient exhibited by the p-n junction corresponding to $V_{be,206}$ in the third input transistor 206. This negative temperature coefficient may be referred to as a Complementary To Absolute Temperature (CTAT) coefficient.

The difference $\Delta V_{be}$ between $V_{be}$ of the third input transistor 206 and of the first input transistor 208 (the potential difference between nodes 209 and 218, or over resistor 212), is given by:

$$\Delta V_{be} = V_{be,206} - V_{be,208} = \frac{k \cdot T}{q} \cdot \ln\left(\frac{I_{c,206} \cdot I_{0,208}}{I_{c,208} \cdot I_{0,206}}\right)$$

The current flowing through the resistor 212 is given by:

$$I_{212} = \frac{\Delta V_{be}}{R_{212}} = \frac{k \cdot T}{R_{212} \cdot q} \cdot \ln\left(\frac{I_{c,206} \cdot I_{0,208}}{I_{c,208} \cdot I_{0,206}}\right)$$

Here, $$M = \frac{I_{c,206}}{I_{c,208}}$$

and $$N = \frac{I_{0,208}}{I_{0,206}}$$

The voltage across the resistor 214 is thus given by:

$$V_{214} = (2I_{212} \cdot R_{214}) + (I_{212} \cdot R_{214} \cdot M) = \frac{k \cdot T \cdot R_{214}}{R_{212} \cdot q} \cdot (2 + M) \cdot \ln(M \cdot N)$$

The derivative of $V_{214}$ with respect to temperature (T) is given by:

$$\frac{\partial V_{214}}{\partial T} \approx +0.085 \text{ mV/}°\text{C}.$$

where, k is the Boltzmann constant, q is the charge of an electron, T is temperature.

Thus, the voltage $V_{214}$ across the resistor 214 varies positively with temperature—i.e. it exhibits a positive temperature coefficient. This relies on the positive temperature coefficient exhibited by the difference between the p-n junctions corresponding to $V_{be}$ in the first and third input transistors 208 and 206. This positive temperature coefficient may be referred to as a Proportional To Absolute Temperature (PTAT) coefficient.

The summing together of $V_{214}$ and $V_{be,206}$, as defined above, results in the bandgap voltage reference signal being generated at the reference node 216. The parameters of M, N, $R_{212}$ and $R_{214}$ may be tuned or selected in order to minimise variation in the bandgap voltage reference signal across a required temperature range, so that over that temperature range the bandgap voltage reference signal may be considered temperature-independent. Temperature independence will be understood as such herein.

It is noted as an aside that the resistors 214 and 212 may be considered to operate as a current source for the tail node 209 of the differential amplifier 220, where the common mode gain of the differential amplifier is inversely proportional to the resistance of the resistive current source, and the common mode rejection ratio (CMRR) is directly proportional to the resistance of the resistive current source. From the equations above, the resistances of these two resistors 214 and 212 are two of the factors which can be tuned to minimise variation in the bandgap voltage reference signal across a required temperature range.

The bandgap voltage reference signal may be generated to be between 1.2V and 1.3V thereby generating a temperature independent voltage close to the theoretical 1.22 eV bandgap of silicon at 0K.

Note that the voltage level of a signal at node 218 varies positively with temperature since $V_{214}$ varies positively with temperature and the ground supply voltage 270 is considered to be stable with temperature. Thus, by using that signal as an output signal the signal-generation circuitry 290 could be described as a temperature sensor. Node 218 may also be described as a temperature-sensor node 218. By connecting the temperature-sensor node 218 to external circuitry the signal at node 218 may be used as a temperature-dependent reference voltage signal.

Due to the first input transistor 208 and the first current-mirror transistor 204 being incorporated into the feedback loop of the differential amplifier 220, noise contribution from the first input transistor 208 and the first current-mirror transistor 204 is divided by the feedback loop gain of the differential amplifier 220, which thereby reduces noise experienced by the temperature dependent voltage signal at node 218 and the amplified signal output from the differential amplifier 220 at node 230. This of course reduces noise experienced in the regulated reference voltage signal at the output node 250. Moreover, the noise contribution from the first input transistor 208, the third current-mirror transistor 202 and the third input transistor 206 is filtered by the capacitor 211, which further reduces noise experienced in these signals.

Advantageously, by reducing the number of devices required to generate a voltage-regulated signal due to the shared circuitry, compared to for example in the FIG. 1 circuitry where there is no sharing of components in the sense of FIG. 2, the overall noise contribution of the signal-generation circuitry 290 is reduced.

Advantageously, the voltage-regulated signal generated at the output node 250 may be considered temperature-independent over the temperature range mentioned above, in the same way as the bandgap voltage reference signal may be. The output node 250 may be connected to external circuitry such that the temperature independent voltage-regulated signal is provided to the external circuitry as a regulated-reference signal.

Furthermore, since the signal-generation circuitry 290 performs the function of generating a bandgap voltage reference signal and the related voltage-regulated signal within a single combined circuit, the problem of cross talk and coupling between the reference-voltage generator 100 and multiple LDO output stages 140 is eliminated, since instead multiple instances of the signal-generation circuitry 290 would be provided. Advantageously, each instance of the signal-generation circuitry 290 includes the bandgap reference circuitry 200 and the regulation stage 240 in the same circuit thereby providing its own separate bandgap voltage reference signal and related voltage-regulated signal.

Incidentally, it will be appreciated that the FIG. 2 circuitry could be adapted to be the other way up, swapping n-channel devices for p-channel devices and similar. In that event, however, the bandgap voltage would be relative to supply (VDD) rather than relative to ground (GND), which may be less preferable in general.

Figure 3:
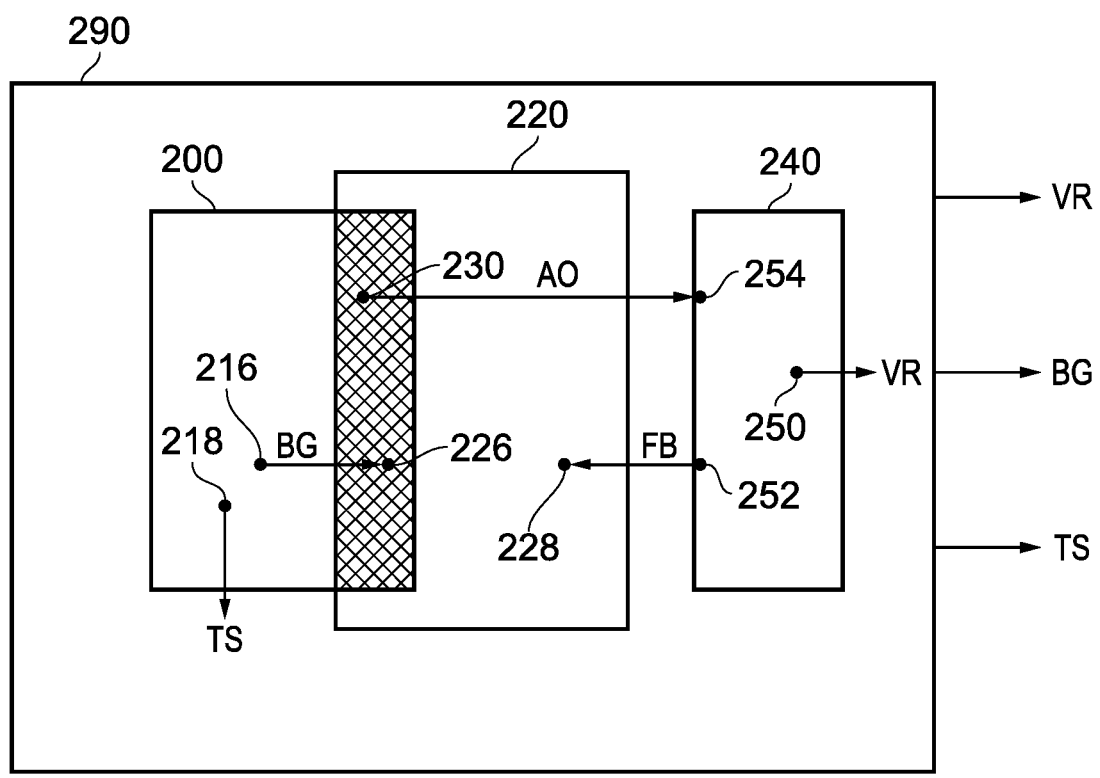
FIG. 3 is another schematic diagram useful for understanding the FIG. 2 circuitry.

By way of summary, FIG. 3 is a schematic overview of the signal-generation circuitry 290 of FIG. 2, but with the circuit components removed for simplicity. As before, the signal-generation circuitry 290 comprises the differential amplifier 220, bandgap reference circuitry 200, and regulation stage 240.

As can be seen schematically by virtue of the shaded overlap, the differential amplifier 220 and the bandgap reference circuitry 200 share some circuit components, namely those on the first current path. For example, there is a shared transistor 208. Indeed, recall that the first current-mirror transistor 204, the first input transistor 208 and the resistors 212 and 214 are common or shared between the bandgap reference circuitry 200 and the differential amplifier 220.

The bandgap reference circuitry 200 produces its bandgap voltage reference signal (BG) at node 216 and its temperature-sensor signal (TS) at node 218. The differential amplifier 220 receives the bandgap voltage reference signal (BG) at node 226 and the feedback signal (FB) at node 228 as generated at node 252 by the regulation stage 240. The differential amplifier 220 outputs its amplifier output signal (AO) at node 230 based on a difference between the bandgap voltage reference signal (BG) and the feedback signal (FB). The regulation stage 240 receives the amplifier output signal (AO) at node 254 and generates the voltage-regulated signal (VR) at node 250 for use by external circuitry.

As indicated, the signal-generation circuitry 290 may output any or all of the voltage-regulated signal (VR), the bandgap voltage reference signal (BG) and the temperature-sensor signal (TS). Thus, the signal-generation circuitry 290 may be considered to be any or all of voltage regulator circuitry (or LDO circuitry), bandgap reference circuitry and temperature-sensor circuitry.

Note that the shared components, in particular transistor 208, play a role in generating all three of these signals. For example, the base terminal of the transistor 208 serves both as the reference node 216 at which the bandgap voltage reference signal is generated and as the first input terminal 226 of the differential amplifier 220. This transistor 208 is within the feedback loop formed using the differential amplifier 220. Note that the common tail node 209 (the emitter terminal of the transistor 208) may also produce a temperature-sensor signal (TS). Note also that the collector terminal of the transistor 208 forms node 230 at which the differential amplifier 220 outputs its amplifier output signal (AO).

By taking advantage of the particular and shared circuit topologies of the bandgap reference circuitry 200 and the differential amplifier 220, a single shared transistor 208 is used to perform multiple functions. By way of contrast, such advantages do not stem from the circuitry of FIG. 1, where there is no such overlap/integration between the reference-voltage generator 100 and the LDO output stage 140.

Figure 4:
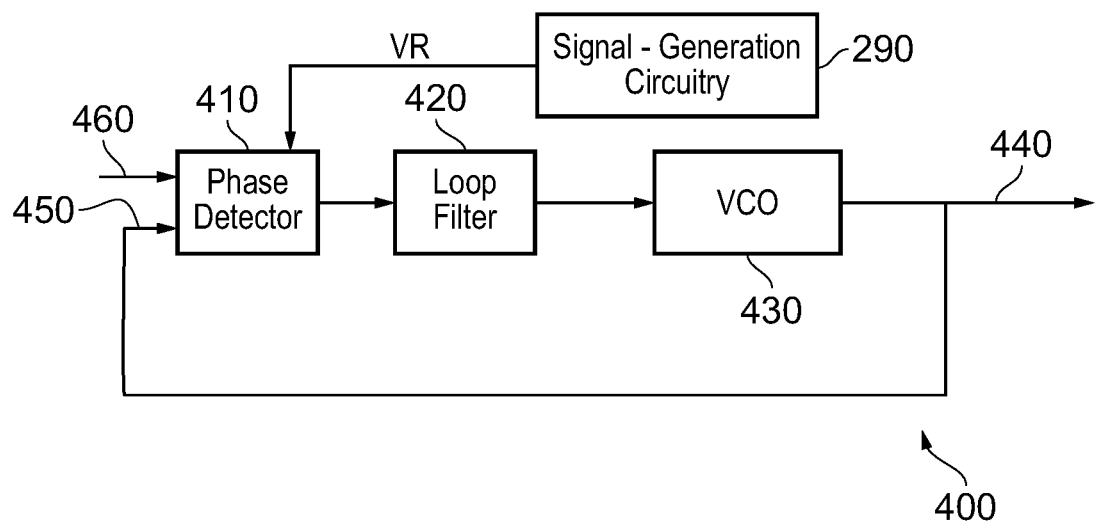
FIG. 4 is a schematic diagram of phase locked loop circuitry which may comprise the signal-generation circuitry of FIG. 2.

FIG. 4 is a schematic diagram of phase locked loop circuitry 400 which comprises the signal-generation circuitry 290. The phase locked loop (PLL) circuitry 400 comprises phase detector 410, loop filter 420, voltage controlled oscillator (VCO) 430, output node 440, feedback node 450, reference node 460 and the signal-generation circuitry 290.

The phase locked loop circuitry 400 is configured to output a signal at the output node 440 which has a desired frequency, by controlling that output signal relative to a reference signal input to the reference node 460 by means of negative feedback.

The phase detector 410 in configured to detect a phase difference between the reference signal input to the reference node 460 and a feedback signal (which may be or be related to the output signal) input to the feedback node 450.

The phase detector 410 outputs a signal generated to be proportional to the detected phase difference to the loop filter 420. The loop filter 420 is a low pass filter configured to filter high frequency signals from the phase detector output signal thereby generating a low frequency signal. The low frequency signal is input to the VCO 430. The VCO 430 is configured to generate a VCO signal as the output signal, having a frequency that is dependent on the magnitude of the low frequency signal received from the loop filter 420.

The phase locked loop circuitry 400 is locked at a specific frequency when the feedback signal input to the feedback node 450 has the same phase angle as the reference signal input to the reference node 460.

The phase detector 410 may comprise a charge pump at its output, to provide the output of the phase detector 410 as a current signal. Such a charge pump may operate based on a voltage-regulated reference signal (VR) output from the signal-generation circuitry 290, for example controlling one or more regulated current sources in that charge pump. Of course, the signal-generation circuitry 290 may be employed in any of the blocks of the PLL, including the VCO 430.

Figure 5:
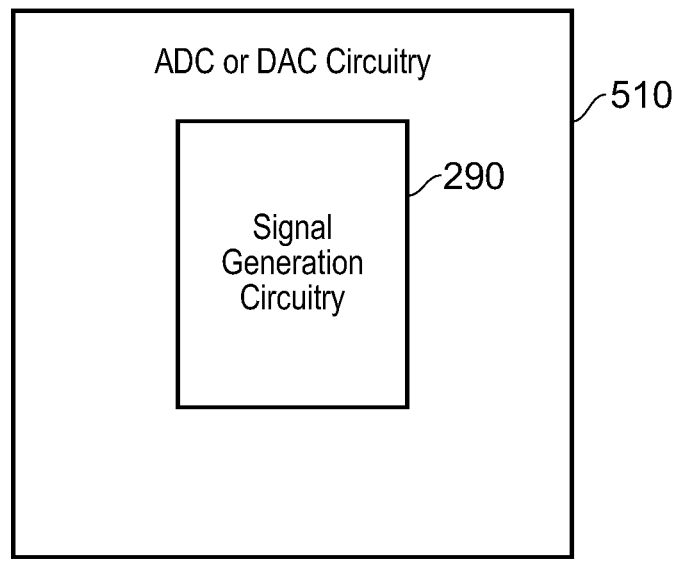
FIG. 5 is a schematic diagram of digital-to-analogue (DAC) circuitry or analogue-to-digital (ADC) circuitry which may comprise the signal-generation circuitry of FIG. 2.

It will be appreciated that the signal-generation circuitry 290 embodying the present invention (perhaps provided within a PLL generating clock signals)) could be provided as part of mixed-signal circuitry such as DAC or ADC circuitry 510, as illustrated in FIG. 5.

It will be appreciated therefore that circuitry disclosed herein could be described as an ADC or DAC, as just two convenient examples. In general, the signal-generation circuitry disclosed herein can be used for any analogue or digital circuit that requires a regulated voltage supply.

Circuitry of the present invention may be implemented as integrated circuitry, for example on an IC chip such as flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

It will be appreciated that BJTs may be replaced by FETs and vice versa. The present disclosure will be understood accordingly.

The present invention may be embodied in many different ways in the light of the above disclosure, within the spirit and scope of the appended claims.

The invention claimed is:

1. Signal-generation circuitry comprising:
    a differential amplifier comprising first and second input transistors connected along first and second corresponding current paths, control terminals of the first and second input transistors serving as corresponding first and second input terminals of the differential amplifier, the differential amplifier having an output terminal at which an amplified signal is output dependent on first and second input signals received at the first and second input terminals, respectively;
    bandgap voltage reference circuitry also comprising said first current path having said first input transistor, the bandgap voltage reference circuitry further comprising a third current path having a third input transistor, wherein the control terminals of the first and third input transistors are connected together to form a reference terminal at which a bandgap voltage reference signal is generated as said first input signal; and
    a regulation stage connected to receive the amplified signal output from the differential amplifier and configured a voltage-regulated signal based thereon, and connected to the second input terminal of the differential amplifier so that the second input signal is a feedback signal dependent on the voltage-regulated signal, wherein:

the first, second and third current paths comprise first, second and third current-mirror transistors, respectively, connected together in a current-mirror arrangement configured to control currents flowing along the first and third current paths so that they are dependent of a current flowing along the second current path due to current mirroring.

2. The signal-generation circuitry according to claim 1, wherein the output terminal of the differential amplifier is a node on the first current path.

3. The signal-generation circuitry according to claim 1, wherein a capacitance is connected between the output terminal and the reference terminal, to filter noise generated by the first and third input transistors at the reference terminal.

4. The signal-generation circuitry according to claim 1, wherein the first and second input transistors are matched transistors, configured in the same way as one another.

5. The signal-generation circuitry according to claim 1, wherein the first, second and third input transistors are bipolar junction transistors, and the control terminals of those transistors are base terminals of those transistors.

6. The signal-generation circuitry according to claim 5, wherein the emitter terminals of the first and second input transistors are connected together forming a common tail node at which the first and second current paths converge.

7. The signal-generation circuitry according to claim 6, wherein the common tail node is connected to the emitter terminal of the third input transistor via a first resistor, the first and second current paths passing from the common tail node through the first resistor, and wherein the emitter terminal, of the third input transistor is connected to a voltage reference source via a second resistor, the first, second and third current paths passing from the emitter terminal of the third input transistor through the second resistor.

8. The signal-generation circuitry according to claim 1, wherein:

the first and third current-mirror transistors have a size ratio 1:M and wherein the first and third input transistors have a size ratio N:1, and wherein the product of M and N is greater than 1, where M and N are positive numbers; or the first and third current-mirror transistors have a size ratio A:B and wherein the first and third input transistors have a size ratio C:D, and wherein the product of B and C is greater than the product of A and D, where A, B, C and D are positive numbers.

9. The signal-generation circuitry according to claim 1, wherein the current-mirror transistors are FETs.

10. The signal-generation circuitry according to claim 1, wherein the reference terminal of the bandgap voltage reference circuitry is for providing a bandgap voltage reference signal to external circuitry, the signal-generation circuitry serving as a bandgap voltage reference source.

11. The signal-generation circuitry according to claim 1, wherein the bandgap voltage reference circuitry comprises a temperature-sensor node which provides a temperature-sensor voltage signal which is dependent on temperature, the signal-generation circuitry serving as a temperature sensor.

12. The signal-generation circuitry according to claim 1, wherein the regulation stage is an output stage, configured to provide the voltage-regulated signal as an output signal at an output terminal of the reference circuitry to power an external circuit, the signal-generation circuitry serving as a voltage regulator.

13. The signal-generation circuitry according to claim 12, wherein the regulation stage comprises an output transistor connected to control a voltage at the output terminal in dependence upon the amplified signal.

14. An integrated circuit comprising the signal-generation circuitry as claimed in claim 1.

15. The integrated circuit of claim 14, wherein the integrated circuit is an IC chip.

16. Signal-generation circuitry comprising:

A differential amplifier comprising a first and second input transistors connected along first and second corresponding current paths, control terminals of the first and second input transistors serving as corresponding first and second input terminals of the differential amplifier, the differential amplifier having an output terminal at which an amplified signal is output dependent on first and second input signals received at the first and second input signals received at the first and second input terminals, respectively;

bandgap voltage reference circuitry also comprising said first current path having said first input transistor, the bandgap voltage reference circuitry further comprising a third current path having a third input transistor, wherein the control terminals of the first and third input transistors are connected together to form a reference terminal at which a bandgap voltage reference signal is generated as said first input signal; and a regulation stage connected to receive the amplified signal output from the differential amplifier and configured to generate a voltage-regulated signal based thereon, and connected to the second input terminal of the differential amplifier so that the second input signal is a feedback signal dependent on the voltage-regulated signal, wherein:

the first, second and third input transistors are bipolar junction transistors, and the control terminals of those transistors are base terminals of those transistors, the emitter terminals of the first and second input transistors are connected together forming a common tail node at which the first and second current paths converge, and the common tail node is connected to the emitter terminal of the third input transistor via a first resistor, the first and second current paths passing from the common tail node through the first resistor, and wherein the emitter terminal of the third input transistor is connected to a voltage reference source via a second resistor, the first, second and third current paths passing from the emitter terminal of the third input transistor through the second resistor.

17. The signal-generation circuitry according to claim 16, wherein the output terminal of the differential amplifier is a node on the first current path.

18. The signal-generation circuitry according to claim 16, wherein a capacitance is connected between the output terminal and the reference terminal, to filter noise, generated by the first and third input transistors at the reference terminal.

19. The signal-generation circuitry according to claim 16, wherein the first and second input transistors are matched transistors, configured in the same way as one another.

20. An integrated circuit comprising the signal-generation circuitry as claimed in claim 16.

* * * * *